United States Patent
Tao et al.

(10) Patent No.: US 8,257,907 B2
(45) Date of Patent: Sep. 4, 2012

(54) NEGATIVE-WORKING IMAGEABLE ELEMENTS

(75) Inventors: Ting Tao, Fort Collins, CO (US); Eric E. Clark, Loveland, CO (US); John Kalamen, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 359 days.

(21) Appl. No.: 12/483,293

(22) Filed: Jun. 12, 2009

(65) Prior Publication Data

US 2010/0316850 A1  Dec. 16, 2010

(51) Int. Cl.
*G03F 7/00* (2006.01)
*G03F 7/26* (2006.01)
*B41F 7/00* (2006.01)

(52) U.S. Cl. .......... 430/281.1; 430/270.1; 430/302; 101/450.1; 101/453; 101/463.1

(58) Field of Classification Search .......... 430/270.1, 430/302
See application file for complete search history.

(56) References Cited

U.S. PATENT DOCUMENTS

| | | | | |
|---|---|---|---|---|
| 3,411,912 A | * | 11/1968 | Dykstra et al. | 430/535 |
| 5,478,690 A | | 12/1995 | Kanda et al. | |
| 5,609,980 A | | 3/1997 | Matthews et al. | |
| 6,030,750 A | | 2/2000 | Vermeersch et al. | |
| 6,110,644 A | | 8/2000 | Vermeersch et al. | |
| 6,218,073 B1 | | 4/2001 | Shimizu et al. | |
| 6,509,133 B1 | | 1/2003 | Watanabe et al. | |
| 6,627,380 B2 | | 9/2003 | Saito et al. | |
| 6,692,880 B2 | | 2/2004 | Tyagi et al. | |
| 6,919,163 B2 | * | 7/2005 | Oohashi et al. | 430/273.1 |
| 7,318,995 B2 | * | 1/2008 | Wilkinson et al. | 430/302 |
| 2009/0202816 A1 | * | 8/2009 | Schlenoff | 428/331 |
| 2010/0166664 A1 | * | 7/2010 | Butts et al. | 424/9.32 |

FOREIGN PATENT DOCUMENTS

| | | |
|---|---|---|
| EP | 0 513 493 A1 | 11/1992 |
| EP | 0 514 145 | 11/1992 |
| EP | 1 371 500 A1 | 12/2003 |
| EP | 1 642 714 | 10/2007 |
| WO | WO 03/087939 A2 * | 10/2003 |
| WO | 2007/146680 | 12/2007 |

OTHER PUBLICATIONS

U.S. Appl. No. 12/412,400, filed Mar. 27, 2009, titled Negative-Working Thermal Imageable Elements, by M. Jarek et al.
U.S. Appl. No. 12/017,366, filed Jan. 22, 2008, titled Imageable Elements With Coalescing Core-Shell Particles, by M. Jarek.

* cited by examiner

*Primary Examiner* — Cynthia Kelly
*Assistant Examiner* — Chanceity Robinson
(74) *Attorney, Agent, or Firm* — J. Lanny Tucker (57) ABSTRACT

Negative-working imageable elements have an imageable layer comprising a free radically polymerizable component, an initiator composition capable of generating radicals sufficient to initiate polymerization of the free radically polymerizable component upon exposure to imaging radiation, a radiation absorbing compound, one or more polymeric binders, and at least 5 weight % of core-shell particles comprising a hydrophobic polymeric core and a hydrophilic polymeric shell that is covalently bound to the polymeric core. The hydrophilic polymeric shell has one or more zwitterionic functional groups. These elements can be imaged such as by IR lasers to provide lithographic printing plates.

17 Claims, 1 Drawing Sheet

NEGATIVE-WORKING IMAGEABLE ELEMENTS

FIELD OF THE INVENTION

This invention relates to negative-working imageable elements that contain core-shell particles in the imaging layer that have zwitterionic functional groups in the shell. This invention also relates to a method of providing imaged and processed elements such as lithographic printing plates.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics. Such compositions are generally provided as imageable layers.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

There is a continuing need in the industry to improve the various properties of negative-working lithographic printing plate precursors, for example, to increase photospeed so that less energy is require for sufficient exposure to provide desired hardening of the exposed regions and clean development of the non-exposed regions.

SUMMARY OF THE INVENTION

This invention provides a negative-working imageable element comprising a substrate having thereon an imageable layer comprising:
a free radically polymerizable component,
an initiator composition capable of generating radicals sufficient to initiate polymerization of the free radically polymerizable component upon exposure to imaging radiation,
a radiation absorbing compound,
one or more polymeric binders, and
at least 5 weight % of core-shell particles comprising a hydrophobic polymeric core and a hydrophilic polymeric shell that is covalently bound to the polymeric core, the hydrophilic polymeric shell comprising one or more zwitterionic functional groups.

In some embodiments, an infrared radiation-sensitive negative-working lithographic printing plate precursor comprises an aluminum-containing substrate having thereon an imageable layer comprising:
a free radically polymerizable component,
an initiator composition capable of generating radicals sufficient to initiate polymerization of the free radically polymerizable component upon exposure to imaging radiation, the initiator composition comprising an iodonium borate salt,
an infrared radiation absorbing dye,
one or more polymeric binders, and
from about 10 to about 30 weight % of core-shell particles comprising a hydrophobic polymeric core comprising recurring units of one or more $C_1$ to $C_3$ alkyl methacrylates and a hydrophilic polymeric shell that is covalently bound to the polymeric core, the hydrophilic polymeric shell comprising recurring units comprising sulfobetaine functional groups, wherein the weight ratio of hydrophilic polymeric shell to hydrophobic polymeric core in the core-shell particles is from about 1:15 to about 1:6.

This invention also provides a method of providing an imaged element comprising:
A) imagewise exposing the negative-working imageable element of this invention to form exposed and non-exposed regions,
B) developing the imagewise exposed element off-press using a processing solution to remove predominantly only the non-exposed regions.

This method can be used, for example, to provide an imaged lithographic printing plate that has an anodized aluminum-containing substrate.

We discovered that the use of the specific core-shell polymeric particles described herein in negative-working imaging compositions and elements provides unexpected advantages. The polymeric particles are surprisingly stable in organic solvents (such as alcohols and ketones) or water/solvent mixtures typically used to coat lithographic printing plate imaging compositions. By "stable", we mean the polymeric particles do not agglomerate or dissolve in the coating solvent mixtures. A representative test for stability is described below in the descriptions of the syntheses of Polymer Latexes A-E. The use of these core-shell polymeric particles unexpectedly provides an improvement in photospeed (sensitivity) by a mechanism that we do not currently understand.

DETAILED DESCRIPTION OF THE INVENTION

Unless the context indicates otherwise, when used herein, the terms "negative-working imageable element" and "lithographic printing plate precursor" are meant to be references to embodiments of the present invention.

In addition, unless the context indicates otherwise, the various components described herein such as "free radically polymerizable component", "radiation absorbing compound", "polymeric binder", "initiator", and similar terms also refer to mixtures of such components. Thus, the use of the articles "a", "an", and "the" are not necessarily meant to refer to only a single component.

Moreover, unless otherwise indicated, percentages refer to percents by dry weight.

The imageable elements of this invention are generally "single-layer" imageable elements by which we mean that the elements contain only one imageable layer that is essential for imaging and this layer can be the outermost layer, but such elements may also include one or more layers under the imageable layer for various purposes or a topcoat disposed over the imageable layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of from about 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imageable Layers

The imageable elements include a radiation-sensitive composition disposed on a suitable substrate to form an imageable layer. The imageable elements may have any utility wherever there is a need for an applied coating that is crosslinkable using suitable imaging radiation, and particularly where it is desired to remove non-exposed regions of the coating instead of exposed regions. The radiation-sensitive compositions can be used to prepare an imageable layer in imageable elements such as printed circuit boards for integrated circuits, microoptical devices, color filters, photomasks, and printed forms such as lithographic printing plate precursors that are defined in more detail below.

The free radically polymerizable component used in the radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and crosslinkable polymers, or various combinations of such compounds.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane (meth)acrylates, epoxide (meth)acrylates, polyester (meth)acrylates, polyether (meth)acrylates, free-radical crosslinkable polymers, and unsaturated polyester resins can also be used. In some embodiments, the radically polymerizable component may comprise carboxy groups.

Particularly useful free radically polymerizable components include free-radical polymerizable monomers or oligomers that comprise polymerizable ethylenically unsaturated groups including multiple acrylate and methacrylate groups and combinations thereof, or free-radical crosslinkable polymers, or combinations of these classes of materials. More particularly useful free radically polymerizable compounds include those derived from urea urethane (meth)acrylates or urethane (meth)acrylates having multiple polymerizable groups. For example, a most preferred free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Other useful free radically polymerizable compounds include NK Ester A-DPH (dipentaerythritol hexaacrylate) that is available from Kowa American, and free radically polymerizable compounds are available from Sartomer Company, Inc. such as Sartomer 399 (dipentaerythritol pentaacrylate), Sartomer 355 (di-trimethylolpropane tetraacrylate), Sartomer 295 (pentaerythritol tetraacrylate), Sartomer 415 [ethoxylated (20) trimethylolpropane triacrylate], and others that would be readily apparent to one skilled in the art.

Also useful are urea urethane (meth)acrylates and urethane (meth)acrylates described in U.S. Pat. No. 6,582,882 (Pappas et al.), U.S. Pat. No. 6,899,994 (Huang et al.), and U.S. Pat. No. 7,153,632 (Saraiya et al.) and WO 2007/077207, all of which are incorporated herein by reference.

Numerous other free radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (Fujimaki et al.), beginning with paragraph [0170].

The free radically polymerizable component is present in the radiation-sensitive composition in an amount sufficient to render the composition insoluble in an aqueous developer after exposure to radiation. This is generally from about 10 to about 70 weight % and typically from about 20 to about 50 weight % based on the dry weight of the radiation-sensitive composition.

The radiation-sensitive composition includes an initiator composition that is capable of generating radicals sufficient to initiate polymerization of the radically polymerizable component upon exposure to the appropriate imaging radiation. The initiator composition may be responsive, for example, to electromagnetic radiation in the infrared spectral regions, corresponding to the broad spectral range of from about 700 nm to about 1400 nm, and typically from about 700 nm to about 1200 nm. Alternatively, the initiator composition may be responsive to exposing radiation in the violet region of from about 250 to about 450 nm and typically from about 300 to about 450 nm.

There are numerous compounds known in the literature that can be used in this manner including but not limited to, organic boron salts, s-triazines, benzoyl-substituted compounds, onium salts (such as iodonium, sulfonium, diazonium, and phosphonium salts), trihaloalkyl-substituted compounds, metallocenes (such as titanocenes), ketoximes, thio compounds, organic peroxides, or a combination of two or more of these compounds. Hexaarylbiimidazoles, onium compounds, and thiol compounds as well as mixtures of two or more thereof are desired coinitiators or free radical generators, and especially hexaarylbiimidazoles and mixtures thereof with thiol compounds are useful.

Suitable hexaarylbiimidazoles are for example described in U.S. Pat. No. 4,565,769 (Dueber et al.) and U.S. Pat. No.

3,445,232 (Shirey) and can be prepared according to known methods, such as the oxidative dimerization of triarylimidazoles. A summary of the chemistry of hexaarylbiimidazoles is found in the following reference: R. Dessauer, "The Invention of Dylux Instant-Access Imaging Materials and the Development of HABI Chemistry—A Personal History" in *Advances in Photochemistry*, D. C. Neckers, W. S. Jenks, T. Wolff (Eds.), Vol. 28, John Wiley & Sons, Hoboken, N.J., 2005, pp. 129-261.

In the present invention, one or more coinitiators can be used. The amount of coinitiator(s) is not particularly restricted. However, it is generally in the range of from about 0.2 to about 25 wt. %, or typically from about 0.5 to about 15 wt. %, based on the dry layer weight.

Other suitable initiator compositions comprise compounds that include but are not limited to, amines (such as alkanol amines), thiol compounds, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxy-phthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety, "co-initiators" described in U.S. Pat. No. 5,629,354 (West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile) as described for example in U.S. Pat. No. 4,565,769 (Dueber et al.), borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (Huang et al.).

The IR-radiation sensitive initiator compositions generally comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), U.S. Pat. No. 6,051,366 (Baumann et al.), and U.S. Pat. No. 7,368,215 (Munnelly et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Some useful boron components include organic boron salts that include an organic boron anion such as those described in U.S. Pat. No. 6,569,603 (Furukawa) that is paired with a suitable cation such as an alkali metal ion, an onium, or a cationic sensitizing dye. Useful onium cations include but are not limited to, ammonium, sulfonium, phosphonium, iodonium, and diazonium cations. Iodonium salts and particularly iodonium borates are particularly useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the IR radiation-sensitive composition.

Useful IR radiation-sensitive initiator compositions can comprise one or more diaryliodonium borate compounds, each of which is represented by the Structure (IB) that is described in more detail in U.S. Pat. No. 7,524,614 (Tao et al.) that is incorporated herein by reference.

(IB)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Both "symmetric" and "asymmetric" diaryliodonium borate compounds are contemplated by this invention but the "symmetric" compounds are useful (that is, they have the same groups on both phenyl rings). Despite what type of X and Y groups are present in the iodonium cation, the sum of the carbon atoms in the X and Y substituents is from about 6, and typically from about 8, to about 40. In Structure IB, p and q are independently 0 or integers of 1 to 5, provided that either p or q is from about 1.

Z⁻ is an organic borate anion represented by the following Structure (IBz):

(IBz)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazolyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Useful compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The initiator composition including one or more initiator compounds is generally present in the radiation-sensitive composition in an amount of from about 0.5% to about 30%, based on the total solids of the radiation-sensitive composition or the dry weight of the coated imageable layer. For example, the initiator composition is present in an amount of from about 2% to about 20 weight %. In the most embodiments, one or more diaryliodonium borate compounds generally comprise from about 10 to about 100% of the initiator composition.

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 375 nm and up to and including 475 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.), WO 2004/074929 (Baumann et al.) that describes useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Other useful sensitizers for the violet region of sensitization are the 2,4,5-triaryloxazole derivatives as described in WO 2004/074930 (Baumann et al.). These compounds can be used alone or with a co-initiator as described above.

The IR radiation-sensitive composition sensitivity is provided by the presence of one or more infrared radiation absorbing compounds, chromophores, or sensitizers that absorb imaging radiation, or sensitize the composition to imaging infrared radiation having a $\lambda_{max}$ of from about 700 nm and up to and including 1400 nm, and typically from about 700 to about 1200 nm.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (De-Boer).

Still other useful infrared radiation absorbing compounds are copolymers that can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The radiation absorbing compounds (or sensitizers) can be present in the radiation sensitive composition (or imageable layer) in an amount generally of at least 1% and up to and including 30% and typically at least 3 and up to and including 20%, based on total solids in the composition, that also corresponds to the total dry weight of the imageable layer. The particular amount needed for this purpose would be readily apparent to a skilled worker in the art.

The radiation-sensitive composition includes one or more polymeric binders that are generally used for off-press developability include any alkaline solution soluble (or dispersible) polymer having an acid value of from about 20 to about 400 (typically from about 30 to about 200). The following described polymeric binders are particularly useful in the manner but this is not an exhaustive list and further details are provided in U.S. Patent Application Publication 2008/0280229 (Tao et al.) that is incorporated herein by reference.

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference.

II. Polymers having pendant allyl ester groups as described in U.S. Pat. No. 7,332,253 (Tao et al.) that is incorporated herein by reference. Such polymers may also include pendant cyano groups or have recurring units derived from a variety of other monomers as described in Col. 8, line 31 to Col. 10, line 3 of the noted patent.

III. Polymers having all carbon backbones wherein at least 40 and up to 100 mol % (and typically from about 40 to about 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached).

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. Further details of useful polymer binders are provided in U.S. Patent Application Publication 2008/0280229 (Tao et al.).

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (noted above) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

Some useful pendant reactive vinyl groups are alkenyl groups including but not limited to allyl esters, styryl, and (meth)acryloyl groups. For example, such groups can be provided from allyl (meth)acrylates, or by reacting a polymer precursor with an allyl halide, 4-vinylbenzyl chloride, or (meth)acryloyl chloride using conditions that would be apparent to a skilled worker in the art.

V. Polymeric binders can have pendant 1H-tetrazole groups as described in U.S. Ser. No. 11/949,810 (filed Dec. 4, 2007 by Baumann, Dwars, Strehmel, Simpson, Savariar-Hauck, and Hauck) that is incorporated herein by reference.

VI. Still other useful polymeric binders may be homogenous, that is, dissolved in the coating solvent, or may exist as discrete particles and include but are not limited to, (meth) acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/ acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenyl maleimide are useful.

Other useful polymeric binders are particulate poly(urethane-acrylic) hybrids that are distributed (usually uniformly) throughout the imageable layer. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles.

The polymeric binder is generally present in the radiation-sensitive composition (and imageable layer) in an amount of at least 5 and up to 70 weight %, and typically from about 10 to about 50 weight % based on the total solids in the composition and layer.

Core-shell Particles

The core-shell particles used in the practice of this invention have a hydrophobic polymeric core and a hydrophilic polymeric shell that is covalently bound to the polymeric core. Spectroscopic evidence of the covalent bonding of the core and shell polymers is provided for one embodiment of the particles in FIG. 1, as explained below in the Examples. These particles have unique stability that enables them to be used readily in organic solvents and solvent/water mixtures that are typically used to coat lithographic printing plate radiation-sensitive compositions. These desirable properties are provided by the zwitterionic functional groups in the polymers used to comprise the particle shell.

Such zwitterionic functional groups include but are not limited to, sulfobetaines, carboxybetaines, phosphabetaines, and sulfabetaines. In most embodiments, such zwitterionic functional groups can be represented by the following Structure (ZW):

$$-N^+(R^1)(R^2)-(CH_2)_n-A^- \quad (ZW)$$

wherein $R^1$ and $R^2$ are independently hydrogen or a substituted or unsubstituted alkyl (generally having 1 to 10 carbon atoms) or aryl group (such as substituted or unsubstituted phenyl and naphthyl groups), n is an integer of from 1 to 8 (typically 2 to 4), and $A^-$ is a $-SO_3^-$, $-CO_2^-$, $-SO_4^-$, or $-OPO_3^-$ group.

Examples of zwitterionic functional groups include but are not limited to, those provided by the ethylenically unsaturated polymerizable monomers 2-(methacryloyloxy)ethyldimethyl-(3-sulfopropyl)ammonium hydroxide inner salt and 3-(methacryloylamino)propyldimethyl-(3-sulfopropyl)ammonium hydroxide inner salt (both of which can be obtained from Aldrich Chemical Company), [2-methacrylolylethyl] dimethyl-(2-carboxyethyl)ammonium betaine inner salt as described in U.S. Pat. No. 7,008,751 (Tao et al., Example 10) and in WO 2007/146680 (Schlenoff, page 13, lines 5-30), both incorporated herein by reference. Mixtures of various monomers can be used. Thus, the hydrophilic polymeric shell can comprise two or more different zwitterionic groups.

Such monomers can be the ones used to prepare the shell polymers, or they can be co-polymerized with one or more ethylenically unsaturated polymerizable monomers that lack the zwitterionic functional groups. Such monomers include but are not limited to, [2-(methacryloyloxy)ethyl]triethylammonium chloride, [2-(methacryloyloxy)ethyl]trimethylammonium methyl sulfate, [3-(methacryloylamino)propyl]trimethylammonium chloride, [2-(acryloyloxy)ethyl] triethylammonium chloride, and (3-acrylamidopropyl) trimethylammonium chloride (all from Aldrich Chemical Co.). Thus, the hydrophilic polymeric shell can comprise a copolymer comprising recurring units derived from one or more ethylenically unsaturated polymerizable monomers having a zwitterionic group and recurring units derived from one or more ethylenically unsaturated polymerizable monomers not having zwitterionic groups, in which the recurring units having zwitterionic groups comprise at least 50 mole % of the total recurring units. However, in most embodiments, at least 70 mol % and up to 100% of the recurring units in the shell polymers are derived from one or more monomers having zwitterionic functional groups.

The polymeric core of the core-shell particles is generally prepared from one or more hydrophobic polymers having recurring units derived from one or more alkyl (meth)acrylates wherein the alkyl group has 1 to 8 carbon atoms. These polymers can thus have recurring units derived from one or more of methyl acrylate, methyl methacrylate, ethyl acrylate, ethyl methacrylate, n-propyl acrylate, and iso-propyl methacrylate, and halo-substituted corresponding monomers. Particularly useful monomers include those with $C_1$ to $C_2$ alkyl groups.

The core-shell particles are present in the imageable layer in an amount of at least 5 weight %, typically from about 5 to about 50 weight %, or from about 10 to about 30 weight %, based on total layer dry weight.

The weight ratio of hydrophilic polymeric shell to hydrophobic polymeric core in the core-shell particles is generally from about 1:20 to about 1:4, or typically from about 1:15 to about 1:6. The particles generally have an average size (largest dimension) of from about 10 nm to about 150 nm as measured using, for example, a MICROTRAC-UPA 100 analyzer (Honeywell, Inc.).

The core-shell polymers can be prepared using generally known polymerization conditions. The preparations of Polymer Latexes A and B shown below are representative of such synthetic methods. Useful monomers, polymerization initiators and surfactants can be obtained from a number of commercial sources.

The radiation-sensitive composition (and imageable layer) can also include a variety of optional compounds including but not limited to, dispersing agents, humectants, biocides, plasticizers, surfactants for coatability or other properties, viscosity builders, contrast dyes or colorants (such as crystal violet, methyl violet, ethyl violet, Victoria Blue B, Victoria Blue R, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The imageable elements can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition that is directly applied to the substrate without any intermediate layer.

The imageable element may include what is conventionally known as an overcoat (also known as an "oxygen impermeable topcoat" or "oxygen barrier layer") disposed over the imageable layer for example, as described in WO 99/06890 (Pappas et al.). Such topcoat layers comprise one or more water-soluble polymer binders chosen from such polymers as poly(vinyl alcohol)s, poly(vinyl pyrrolidone), poly(ethyleneimine), poly(vinyl imidazole), and copolymers of two or more of vinyl pyrrolidone, ethyleneimine, and vinyl imidazole, and generally have a dry coating weight of at least 0.1 and up to and including 2 $g/m^2$ (typically from about 0.1 to about 0.5 $g/m^2$) in which the water-soluble polymer(s) comprise at least 50% and up to 98% of the dry weight of the topcoat layer. Topcoat layer polymer binders are also described in U.S. Pat. No. 3,458,311 (Alles), U.S. Pat. No. 4,072,527 (Fanni), and U.S. Pat. No. 4,072,528 (Bratt), and EP Publications 275,147A2 (Wade et al.), 403,096A2 (Ali), 354,475A2 (Zertani et al.), 465,034A2 (Ueda et al.), 352, 630A2 (Zertani et al.), U.S. Pat. No. 1,788,429 (Loccufier et al.), U.S. Pat. No. 1,788,431 (Van Damme et al.) and U.S. Pat. No. 1,788,434 (Van Damme et al.) and US Patent Application Publication 2005/0266349 (Van Damme et al.).

The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid-anodized aluminum support that provides a hydrophilic surface for lithographic printing.

Sulfuric acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$. When sulfuric acid is used for anodization, higher oxide weight (at least 3 $g/m^2$) may provide longer press life.

The aluminum support may also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support may be treated with a phosphate solution that may further contain an inorganic fluoride (PF). The aluminum substrate can be electrochemically-grained, sulfuric acid-anodized, and treated with PVPA or PF using known procedures.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imageable element.

A radiation-sensitive composition containing the components described above can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the free radically polymerizable component, initiator composition, polymeric binder, radiation absorbing compound, core-shell particles, and any other components of the radiation-sensitive composition in a suitable coating solvent including water, organic solvents [such as glycol ethers including methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents (mixtures) and imageable layer formulations are described in the Invention Examples below. After proper drying, the coating weight of the imageable layer is generally at least 0.1 and up to and including 5 $g/m^2$ or at least 0.5 and up to and including 3.5 $g/m^2$.

Imaging Conditions

During use, the imageable element is exposed to a suitable source of exposing radiation depending upon the radiation absorbing compound present in the radiation-sensitive composition, at a wavelength of from about 250 to about 450 nm or from about 700 to about 1500 nm. For example, imaging can be carried out using imaging or exposing radiation, such as from an infrared laser (or array of lasers) at a wavelength of at least 750 nm and up to and including about 1400 nm and typically at least 700 nm and up to and including 1200 nm. Imaging can be carried out using imaging radiation at multiple wavelengths at the same time if desired.

The lasers used to expose the imageable element is usually a diode laser (or array of lasers), because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 nm and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Kodak Trendsetter platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Thermal imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 250 nm and up to and including 450 nm), can be carried out generally using energies of at least 0.01 mJ/cm$^2$ and up to and including 0.5 mJ/cm$^2$, and typically at least 0.02 and up to and including about 0.1 mJ/cm$^2$. It would be desirable, for example, to image the UV/visible radiation-sensitive imageable elements at a power density in the range of at least 0.5 and up to and including 50 kW/cm$^2$ and typically of at least 5 and up to and including 30 kW/cm$^2$, depending upon the source of energy (violet laser or excimer sources)

After imaging of negative-working imageable elements, a heating step might be used to accelerate the formation of a latent image. This heating step can be realized in so called "preheat units" that can be a separate machine or integrated into the processor that develops the imaged element. There are different types of preheat units. The most common ones use infrared radiation or hot air circulation, or combination thereof, to heat the imaged element. The temperature used for the purpose is from about 70 to about 200° C. and typically from about 90 to about 160° C.

Before developing the imaged element, a pre-rinse step might be carried out especially for the negative-working elements having a protective oxygen barrier or topcoat. This pre-rinse step can be carried out in a stand-alone apparatus or by manually rinsing the imaged element with water or the pre-rinse step can be carried out in a washing unit that is integrated in a processor used for developing the imaged element. For the free radical generating radiation-sensitive compositions and imageable elements, both the preheat unit and the pre-rinse unit are usually integrated into the processor used for developing the imaged element.

Development and Printing

After imaging, the imaged elements are generally processed "off-press" using an alkaline processing solution described herein. Processing is carried out for a time sufficient to remove predominantly only the non-exposed regions of the outermost imaged imageable layer to reveal the hydrophilic surface of the substrate, but not long enough to remove significant amounts of the exposed regions. The revealed hydrophilic surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Development can be accomplished using what is known as "manual" development, "dip" development, or processing with an automatic development apparatus (processor). In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for about 10 to about 60 seconds (especially from about 20 to about 40 seconds) under agitation, followed by rinsing with water with or without rubbing with a sponge or cotton pad. The use of automatic development apparatus is well known and generally includes pumping a developer into a developing tank or ejecting it from spray nozzles. The imaged element is contacted with the developer in an appropriate manner. The apparatus may also include a suitable rubbing mechanism (for example a brush or roller) and a suitable number of conveyance rollers. Some developing apparatus include laser exposure means and the apparatus is divided into an imaging section and a developing section.

Developers or processing solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally greater than 7 and up to 14. The imaged elements are generally developed using conventional processing conditions. Both aqueous alkaline developers and organic solvent-containing developers can be used.

Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and preferably, they are alkaline in pH.

Representative solvent-based developers include ND-1 Developer, Developer 980, Developer 1080, 2 in 1 Developer, 955 Developer, D29 Developer (described below), and 956 Developer (all available from Eastman Kodak Company).

Useful developers can also be prepared from concentrated solutions that are prepared with less than 60 weight % water and also include a water-soluble or water-miscible organic solvent, one or more alkyl ether carboxylic acid, coconut oil alkanolamine, coconut fatty alcohol polyglycol ether, β-naphtholethoxylate, and block propylene oxide-ethylene oxide in an amount of at least 0.1 and up to 50 weight % solids, and optionally an alkyl naphthalene sulfonate in an amount of up to 40 weight % solids. The developer concentrate can be diluted up to 80:1 or greater with water and used to process imaged lithographic printing plate precursors.

In some instances, a single processing solution is used to both develop the imaged element by removing predominantly the non-exposed regions and also to provide a protective layer or coating over the entire imaged and developed surface. In this aspect, the processing solution can behave somewhat like a gum that is capable of protecting the lithographic image on the printing plate against contamination or damage (for example, from oxidation, fingerprints, dust, or scratches). Such processing solutions are described for example in copending and commonly assigned U.S. Ser. No. 12/104,544 (filed Apr. 17, 2008 by Ray, Yu, and Saraiya) that is incorporated herein by reference. Such processing solutions generally have a pH greater than 2 and up to about 11, and typically from about 6 to about 11, or from about 6 to about 10.5, as adjusted using a suitable amount of an acid or base. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

The one or more anionic surfactants can be generally present in an amount of at least 1 weight %, and typically from about 5 weight % or from about 8 weight % and up to about 45 weight %, or up to about 30 weight % (% solids). In some embodiments, the one or more anionic surfactants can be present in an amount of from about 8 to about 20 weight %.

Figure 1:
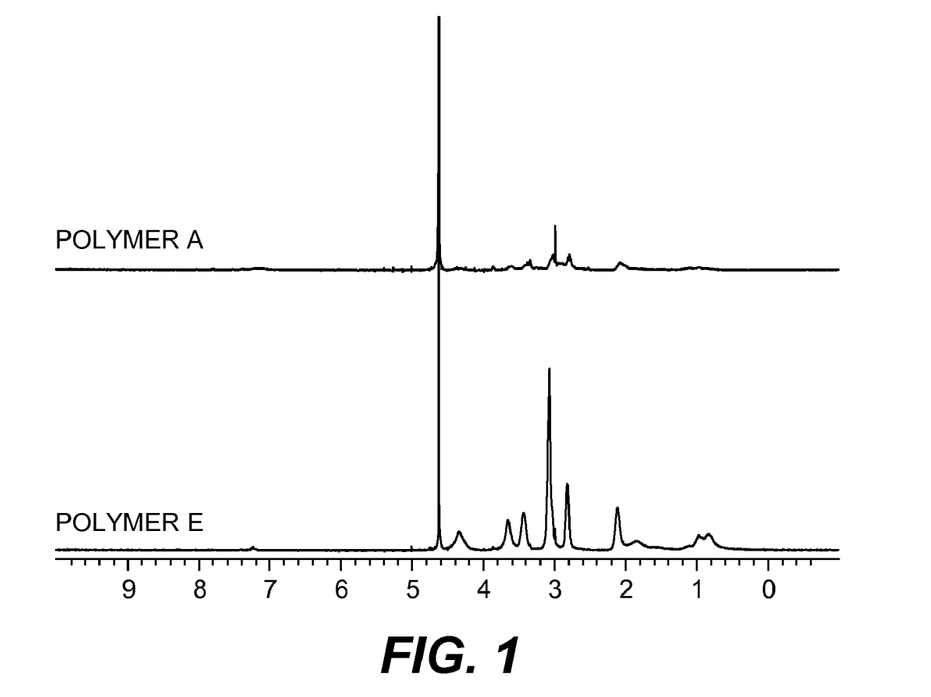
FIG. 1 shows $^1$H NMR spectra obtained from two polymeric latex samples described in the Examples below.
Figure 2:
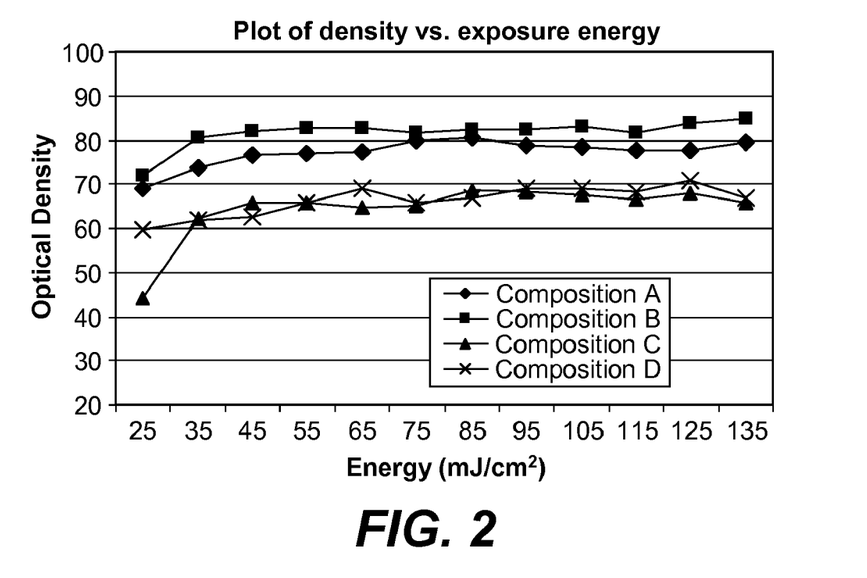
FIG. 2 is a graphical plot of optical density vs. exposure energy (mJ/cm$^2$) for several imaged elements described in the Examples below.

The processing solution (or developer) can be applied to the imaged element by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged element can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). Still again, the imaged element can be immersed in the processing solution and rubbed by hand or with an apparatus.

The processing solution can also be applied in a processing unit (or station) in a suitable apparatus that has at least one roller for rubbing or brushing the imaged element while the processing solution is applied. By using such a processing unit, the non-exposed regions of the imaged layer may be removed from the substrate more completely and quickly. Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Following processing, the resulting lithographic printing plate can be used for printing with or without a separate rinsing step using water.

The resulting lithographic printing plate can also be baked in a postbake operation can be carried out, with or without a blanket or floodwise exposure to UV or visible radiation using known conditions. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The present invention provides at least the following embodiments, in various combinations:

Embodiment 1: A negative-working imageable element comprising a substrate having thereon an imageable layer comprising:
a non-polymeric free radically polymerizable component,
an initiator composition capable of generating radicals sufficient to initiate polymerization of the free radically polymerizable component upon exposure to imaging radiation,
a radiation absorbing compound,
one or more polymeric binders, and
at least 5 weight % of core-shell particles comprising a hydrophobic polymeric core and a hydrophilic polymeric shell that is covalently bound to the polymeric core, the hydrophilic polymeric shell comprising one or more zwitterionic functional groups.

Embodiment 2: The element of embodiment 1 wherein the zwitterionic functional group is a sulfobetaine, carboxybetaine, phosphabetaine, or sulfabetaine.

Embodiment 3: The element of embodiment 1 or 2 wherein the zwitterionic functional group is represented by the following Structure (ZW):

$$-N^+(R^1)(R^2)-(CH_2)_n-A^- \quad (ZW)$$

wherein $R^1$ and $R^2$ are independently hydrogen or a substituted or unsubstituted alkyl or aryl group, n is an integer of from 1 to 6, and $A^-$ is a $-SO_3^-$, $-CO_2^-$, $-SO_4^-$, or $-OPO_3^-$ group.

Embodiment 4: The element of any of embodiments 1 to 3 wherein the core-shell particles are present in the imageable layer in an amount of from about 5 to about 50 weight %.

Embodiment 5: The element of any of embodiments 1 to 4 wherein the hydrophobic polymeric core comprises one or more hydrophobic polymers having recurring units derived from one or more alkyl (meth)acrylates.

Embodiment 6: The element of any of embodiments 1 to 5 wherein the hydrophilic polymeric shell comprises two or more different zwitterionic groups.

Embodiment 7: The element of any of embodiments 1 to 6 wherein the hydrophilic polymeric shell comprises a copolymer comprising recurring units derived from one or more ethylenically unsaturated polymerizable monomers having a zwitterionic group and recurring units derived from one or more ethylenically unsaturated polymerizable monomers not having zwitterionic groups, in which the recurring units having zwitterionic groups comprise at least 50 mole % of the total recurring units.

Embodiment 8: The element of any of embodiments 1 to 7 wherein the weight ratio of hydrophilic polymeric shell to hydrophobic polymeric core in the core-shell particles is from about 1:20 to about 1:4.

Embodiment 9: The element of any of embodiments 1 to 8 that is a lithographic printing plate precursor wherein the substrate is an anodized aluminum-containing substrate.

Embodiment 10: The element of any of embodiments 1 to 9 wherein the radiation absorbing compound is an infrared radiation absorbing dye that is present in an amount of from about 1 to about 30 weight % based on total imageable layer weight.

Embodiment 11: The element of any of embodiments 1 to 10 wherein the initiator composition comprises an onium salt.

Embodiment 12: The element of any of embodiments 1 to 11 wherein the initiator composition comprises an iodonium borate comprising a diaryliodonium borate compound represented by the following Structure (IB):

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, and
Z$^-$ is an organic anion represented by the following Structure (IBz):

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

Embodiment 13: The element of any of embodiments 1 to 12 that further comprises a topcoat disposed on the imageable layer.

Embodiment 14: An infrared radiation-sensitive negative-working lithographic printing plate precursor comprising an aluminum-containing substrate having thereon an imageable layer comprising:
a non-polymeric free radically polymerizable component,
an initiator composition capable of generating radicals sufficient to initiate polymerization of the free radically polymerizable component upon exposure to imaging radiation, the initiator composition comprising an iodonium borate salt, an infrared radiation absorbing dye,
one or more polymeric binders, and
from about 10 to about 30 weight % of core-shell particles comprising a hydrophobic polymeric core comprising recurring units of one or more $C_1$ to $C_3$ alkyl methacrylates and a hydrophilic polymeric shell that is covalently bound to said polymeric core, the hydrophilic polymeric shell comprising recurring units comprising sulfobetaine functional groups, wherein the weight ratio of hydrophilic polymeric shell to hydrophobic polymeric core in the core-shell particles is from about 1:15 to about 1:6.

Embodiment 15: A method of making an imaged element comprising:
A) imagewise exposing the negative-working imageable element of any of embodiments 1 to 14 to form exposed and non-exposed regions,
B) developing the imagewise exposed element off-press using a processing solution to remove predominantly only the non-exposed regions.

Embodiment 16: The method of embodiment 15 wherein the imageable element contains an IR-sensitive dye and the imagewise exposing step A is carried out using radiation having a maximum wavelength of from about 700 to about 1200 nm.

Embodiment 17: The method of embodiment 15 or 16 wherein the imageable element is an infrared radiation-sensitive negative-working lithographic printing plate precursor comprising an aluminum-containing substrate having thereon an imageable layer comprising:
a non-polymeric free radically polymerizable component,
an initiator composition capable of generating radicals sufficient to initiate polymerization of the free radically polymerizable component upon exposure to imaging radiation, the initiator composition comprising an iodonium borate salt, an infrared radiation absorbing dye,
one or more polymeric binders, and
from about 10 to about 30 weight % of core-shell particles comprising a hydrophobic polymeric core comprising recurring units of one or more $C_1$ to $C_3$ alkyl methacrylates and a hydrophilic polymeric shell that is covalently bound to the polymeric core, the hydrophilic polymeric shell comprising recurring units comprising sulfobetaine functional groups, wherein the weight ratio of hydrophilic polymeric shell to hydrophobic polymeric core in the core-shell particles is from about 1:15 to about 1:6.

Embodiment 18: The method of any of embodiments 15 to 17 wherein the processing solution is an organic solvent-containing developer having a pH of from about 6 to about 12.

Embodiment 19: An imaged lithographic printing plate obtained from the method of any of embodiments 15 to 18.

The following examples are provided to illustrate the practice of the present invention but are by no means intended to limit the invention in any manner.

EXAMPLES

The following components were used in the examples:
MEK represents methyl ethyl ketone.
PGME represents 1-methoxy-2-propanol.
BLO represents γ-butyrolactone.
DMAC represents N,N-dimethyl acetamide.
Byk® 307 is a polyethoxylated dimethyl polysiloxane copolymer that was obtained from Byk Chemie (Wallingford, Conn.) in a 10 wt. % PGME solution.
Sipomer PAM-100 is an ethylene glycol methacrylate phosphate with 4-5 ethylene glycol units that was obtained from Rhodia.
IR Dye A is a cyanine dye with the following structure:

3H-Indolium, 2-[2-[3-[(1,3-dihydro-1,3,3-trimethyl-2H-indol-2-ylidene)ethylidene]-2-[(-1-phenyl-1H-tetrazol-5-yl)thio]-1-cyclohexen-1-yl]ethenyl]-1,3,3-trimethyl-, chloride (9CI) ($\lambda_{max}$ of 798 nm), CAS No. 440102-72-7

Initiator A is bis(4-t-butylphenyl) iodonium tetraphenylborate. Sartomer SR-399 is dipentaerythritol pentaacrylate that was obtained from Sartomer Company, Inc. (Exton, Pa.).

Pigment A (951) is a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Developer A comprised 40% benzyl alcohol, 40% Petro AA surfactant (Akzo Nobel Chemicals. Ltd.), 10% diethanolamine, 10% Lugalvan® BNO 24 (from BASF).

Masurf® 1520 is a fluoroaliphatic betaine fluorosurfactant that was obtained from Mason Chemical Company (Arlington Heights, Ill.).

Synthesis of Polymer Latex A:

160 g of DI water, 40 g of methyl methacrylate, 4 g of 2-(methacryloyloxy)ethyldimethyl-(3-sulfopropyl)ammonium hydroxide inner salt, 1.2 g of dodecyl sodium sulfate, and 0.3 g of $K_2S_2O_8$ were placed in a 250-ml 3-necked flask, equipped with magnetic stirring, temperature controller, condenser, and $N_2$ inlet. The mixture was stirred and polymerized under nitrogen at 60° C. for 3 hours. 0.3 g of $K_2S_2O_8$ was added and the reaction was continued at the same condition for another 5 hours. After cooling to room temperature, a white milky dispersion was obtained with 22.3% non-volatile content. The latex was stable (in water) for more than 6 months at ambient conditions. The particle size ranged from 10 nm to 100 nm, with 16.2 nm at the 50 percentile as measured by a MICROTRAC-UPA100 analyzer. The resulting latex (~1 ml) was mixed with 5 ml of MEK/n-propanol (50/50 v/v) in a small glass bottle, and the latex remained dispersed and stable in this solvent system.

Synthesis of Polymer Latex B:

160 g of DI water, 40 g of ethyl methacrylate, 4 g of 2-(methacryloyloxy)ethyldimethyl-(3-sulfopropyl)ammonium hydroxide inner salt, 1.2 g of dodecyl sodium sulfate, and 0.3 g of $K_2S_2O_8$ were placed in a 250-ml 3-necked flask, equipped with magnetic stirring, temperature controller, condenser, and $N_2$ inlet. The mixture was stirred and polymerized under nitrogen at 60° C. for 3 hours. 0.3 g of $K_2S_2O_8$ was added and the reaction was continued at the same condition for another 5 hours. After cooling to room temperature, a white milky dispersion was obtained with 21.9% non-volatile content. The latex was stable (in water) for more than 6 months at ambient conditions. The particle size ranged from 10 nm to 90 nm, with 18.4 nm at the 50 percentile as measured by a MICROTRAC-UPA100 analyzer. The resulting latex (~1 ml) was mixed with 5 ml of MEK/n-propanol (50/50 v/v) in a small glass bottle, and the latex was remained dispersed and stable in this solvent system.

Synthesis of Polymer Latex C:

160 g of DI water, 40 g of butyl methacrylate, 4 g of 2-(methacryloyloxy)ethyldimethyl-(3-sulfopropyl)ammonium hydroxide inner salt, 1.2 g of dodecyl sodium sulfate, and 0.3 g of $K_2S_2O_8$ were placed in a 250-ml 3-necked flask, equipped with magnetic stirring, temperature controller, condenser, and $N_2$ inlet. The mixture was stirred and polymerized under nitrogen at 60° C. for 3 hours. 0.3 g of $K_2S_2O_8$ was added and the reaction was continued at the same condition for another 5 hours. After cooling to room temperature, a white milky dispersion was obtained with 21.8% non-volatile content. The latex was stable (in water) for more than 6 months at ambient conditions. The particle size ranged from 10 nm to 70 nm, with 19.6 nm at the 50 percentile as measured by a MICROTRAC-UPA100 analyzer. The resulting latex (~1 ml) was mixed with 5 ml of MEK/n-propanol (50/50 v/v) in a small glass bottle, but the latex was not stable in this new solvent system and a precipitate was formed.

Synthesis of Polymer Latex D:

40 g of DI water, 9 g of styrene, 1 g of 2-(methacryloyloxy)-ethyldimethyl-(3-sulfopropyl)ammonium hydroxide inner salt, 0.2 g of dodecyl sodium sulfate, and 0.1 g of $K_2S_2O_8$ were placed in a 250-ml 3-necked flask, equipped with magnetic stirring, temperature controller, condenser, and $N_2$ inlet. The mixture was stirred and polymerized under nitrogen at 60° C. for 3 hours. 0.1 g of $K_2S_2O_8$ was added and the reaction was continued at the same condition for another 5 hours. After cooling to room temperature, a white milky dispersion was obtained with 21.9% non-volatile content. The latex was stable (in water) for more than 6 months at ambient conditions. The particle size ranged from 10 nm to 60 nm, with 14.9 nm at the 50 percentile as measured by a MICROTRAC-UPA100 analyzer. The resulting latex (~1 ml) was mixed with 5 ml of MEK/n-propanol (50/50 v/v) in a small glass bottle but the latex was not stable in this solvent system and a precipitate was formed.

Synthesis of Polymer Latex E (No Covalent Bonding Between Core Monomers and Core Monomers):

160 g of DI water, 4 g of 2-(methacryloyloxy)ethyldimethyl-(3-sulfopropyl)ammonium hydroxide inner salt, and 0.1 g of $K_2S_2O_8$ were placed in a 250-ml 3-necked flask, equipped with magnetic stirring, temperature controller, condenser, and $N_2$ inlet. The mixture was stirred and polymerized under nitrogen at 60° C. for 2 hours. 1.2 g of dodecyl sodium sulfate, 40 g of methyl methacrylate, and 0.3 g of $K_2S_2O_8$ were added and the reaction was continued at the same condition for another 5 hours. After cooling to room temperature, a white milky dispersion was obtained with 22.1% non-volatile content. The latex was stable (in water) for more than 6 months at ambient conditions. The particle size ranged from 10 nm to 100 nm, with 19.3 nm at the 50 percentile as measured by a MICROTRAC-UPA100 analyzer. The resulting latex (~1 ml) was mixed with 5 ml of MEK/n-propanol (50/50 v/v) in a small glass bottle but the latex was not stable in this solvent system and a precipitate was formed.

Synthesis of Polymer Latex F:

160 g of DI water, 28 g of acrylonitrile, 8 g of styrene, 4 g of 2-(methacryloyloxy)ethyldimethyl-(3-sulfopropyl)ammonium hydroxide inner salt, 1.2 g of dodecyl sodium sulfate, and 0.3 g of $K_2S_2O_8$ were placed in a 250-ml 3-necked flask, equipped with magnetic stirring, temperature controller, condenser, and $N_2$ inlet. The mixture was stirred and polymerized under nitrogen at 60° C. but it gelled within about 2 hours.

Spectroscopic Evidence for Covalent Bonding Between Shell Monomers and Core Monomers:

1 g of Polymer Latex A (Invention polymer) and 1 g of Polymer Latex E (comparative polymer) were respectively dried in an aluminum dish inside an oven at 40° C. for 5 house, and water was removed and two white powders were obtained. The resulting powders were stirred with 2 g of $D_2O$ respectively in a 10 ml container overnight. About 0.7 ml of the resulting $D_2O$ suspensions of Polymers A and E were transferred into a 5-mm NMR tube respectively. $^1H$ NMR spectra were obtained from these samples, and the results showed strong resonances of the shell polymers from the sample containing Polymer E, while little resonance was detected from the sample containing Polymer A (see FIG. 1). This indicates that the core and shell in the core-shell particles of Polymer Latex A were covalently bound to each other.

Synthesis of Polymer U:

AIBN [2,2'-azobis(iso-butyronitrile), Vazo-64, 1.6 g], methyl methacrylate (12 g), acrylonitrile (25 g), N-vinyl carbazole (18 g, from Polymer Dajac), methacrylic acid (25 g), and DMAC (320 g) were placed in a 1000-ml 3-necked flask, equipped with magnetic stirring, temperature controller, and $N_2$ inlet. The reaction mixture was heated to 75° C. and stirred under nitrogen protection overnight (about 16 hours). The % N.V. was measured with about 20%.

To this reaction mixture (after nitrogen protection was removed), potassium hydroxide (11.8 g) in water (40 g) was slowly added and a viscous liquid was formed. After stirring the mixture for 20 minutes, allyl bromide (25.5 g) was added and the mixture was stirred at 55° C. for 3 hours. Concentrated (36%) hydrochloric acid (23 g) in DMAC (50 g) was added to the flask and the reaction mixture was stirred for another 3 hours. The resulting reaction mixture was then slowly dropped into a mixture of 12 liters of ice water with 20 g of concentrated hydrochloric acid while stirring. The resulting precipitate was filtered and washed with 2000 ml of propanol, followed by washing with 3000 ml of water. A fine white powder was obtained after filtration. The powder was dried at room temperature overnight and then at 50° C. for 3 hours to obtain 81 g of polymer solid.

Synthesis of Polymer V:

4 g of vinyl cabazole, 8 g of PEGMA (50%) 2 g of PMI, and 80 g of DMAC were placed in a 500-ml 3-necked flask, equipped with magnetic stirring, temperature controller, condenser and $N_2$ inlet. The mixture was heated to 75° C. After temperature was stable, 0.4 g of AIBN, 8 g of acrylic acid, 4 g of styrene and 18 g of acrylonitrile in 40 g of DMAC were added dropwise into the flask in 60 minutes and continued stirring for 2.5 hours, and 0.2 g of AIBN was added and further stirring was carried out at 75° C. under $N_2$ protection (slow bubbling) overnight (~16 hours). The solution was then slowly dropped (through an addition funnel) into a mixture of 6 liter of ice/water while severely stirring. The resulting precipitate was filtered to obtain a fine white powder that was dried at room temperature overnight and then at 45° C. for 5 hours. About 39 g of powder was obtained.

Invention Example 1

Imageable Element Using Polymer Latex A

Imageable layer coating composition A shown in TABLE I below was prepared to give a 5.65% w/w solution in a solvent mixture of 36% PGME, 45% MEK, 9% BLO, and 10% water. The resulting formulation was applied to an electrochemically grained, sulfuric acid-anodized, aluminum-containing substrate that had been treated with a phosphate hexafluoride (PF) using a slot coater at 2.2 $cm^3/ft^2$ (23.8 $cm^3/m^2$) and dried to give a dry imageable layer having a coverage of 1.2 $g/m^2$. A topcoat was applied at the same drying condition using a 1.96% w/w aqueous solution containing 99.5% of PVA-405 poly(vinyl alcohol) and 0.5% of Masurf® 1520 surfactant to provide a coverage of 0.4 $g/m^2$. The coating drum temperature was 180° F. (82.2° C.) for a duration of 80 seconds to provide an imageable element (lithographic printing plate precursor) upon cooling.

Samples of the imageable element were imagewise exposed to an 830 nm IR laser at exposure energies at varying from 25 $mJ/cm^2$ to 135 $mJ/cm^2$ using a Kodak Trendsetter 3244× imagesetter, and were then developed using Developer A at a 1:8 dilution charged in a MOA processor (Eastman Kodak Company). Optical density readings ranging from 0.70 to 0.80 were obtained from imaged areas (see the plot of optical density readings vs. exposure energies in FIG. 2).

Another sample of the imageable element was exposed at 75 $mJ/cm^2$ and developed in the same manner. The imaged and processed lithographic printing plate was then mounted onto a Komori sheet-fed press using a wear ink containing 1.5% calcium carbonate and used to produce 60,000 good impressions.

Invention Example 2

Imageable Element Using Polymer Latex B

Imageable layer coating composition B shown in TABLE I below was prepared to give a 5.65% w/w solution in a solvent mixture of 36% PGME, 45% MEK, 9% BLO, and 10% water. The resulting formulation was applied to an electrochemically grained, sulfuric acid-anodized, aluminum-containing substrate that had been treated with a phosphate hexafluoride (PF) as described in Invention Example 1 and dried to give a dry imageable base layer with a coverage of 1.2 $g/m^2$. A topcoat was applied as described in Invention Example 1 and an imageable element (lithographic printing plate precursor) was obtained.

Samples of the imageable element were imagewise exposed to an 830 nm IR laser at exposure energies at varying from 25 $mJ/cm^2$ to 135 $mJ/cm^2$ using a Kodak Trendsetter 3244× imagesetter, and were then developed as described in Invention Example 1. Optical density readings ranging from 0.73 to 0.85 were obtained from imaged areas (see the plot of optical density readings vs. exposure energies in FIG. 2).

Another sample of the imageable element was similarly exposed, developed, and used for printing as in Invention Example 1 to provide 65,000 good impressions.

Comparative Example 1

Imageable Element Using Polymer U

Imageable layer coating composition C shown in TABLE I was prepared to give a 5.65% w/w solution in a solvent mixture of 36% PGME, 45% MEK, 9% BLO, and 10% water. The resulting formulation was applied to an electrochemically grained, sulfuric acid-anodized, aluminum-containing substrate that had been treated with a phosphate hexafluoride (PF) and dried as described in Invention Example 1. A topcoat was also applied as in Invention Example 1 to provide an imageable element (lithographic printing plate precursor).

The imageable element was imagewise exposed to an 830 nm IR laser at exposure energies varying from 25 $mJ/cm^2$ to 135 $mJ/cm^2$ using a Kodak Trendsetter 3244× imagesetter, and was then developed as described in Invention Example 1.

A lower optical density reading ranging from 0.44 to 0.68 was obtained from imaged areas (see the plot of density reading vs. exposure energy in FIG. 2).

Comparative Example 2

Imageable Element Using Polymer V

Imageable layer coating composition D shown in TABLE I below was prepared to give a 5.65% w/w solution in a solvent mixture of 36% PGME, 45% MEK, 9% BLO, and 10% water. The resulting formulation was applied to an electrochemically grained, sulfuric acid-anodized, aluminum-containing substrate that had been treated with a phosphate hexafluoride (PF) as described in Invention Example 1. A topcoat was also applied as described in Invention Example 1 to provide an imageable element (lithographic printing plate precursor).

The imageable element was imagewise exposed and developed as described in Comparative Example 1. A lower optical density reading ranging from 0.59 to 0.70 was obtained from imaged areas (see the plot of density reading vs. exposure energy in FIG. 2).

The invention has been described in detail with particular reference to certain preferred embodiments thereof, but it will be understood that variations and modifications can be effected within the spirit and scope of the invention.

TABLE I

| Components | % Weight of Components in solids | | | |
| --- | --- | --- | --- | --- |
| | Composition A | Composition B | Composition C | Composition D |
| Polymer Latex A | 19.5 | 0 | 0 | 0 |
| Polymer Latex B | 0 | 19.5 | 0 | 0 |
| Initiator A | 7.97 | 7.97 | 7.97 | 7.97 |
| IR Dye A | 2.21 | 2.21 | 2.21 | 2.21 |
| Byk ® 307 | 0.89 | 0.89 | 0.89 | 0.89 |
| Sipomer PAM-100 | 3.43 | 3.43 | 3.43 | 3.43 |
| Sartomer SR399 | 44.3 | 44.3 | 44.8 | 44.8 |
| Pigment A | 6.09 | 6.09 | 6.09 | 6.09 |
| Polymer U | 16.6 | 0 | 34.6 | 0 |
| Polymer V | 0 | 16.6 | 0 | 34.6 |

The invention claimed is:

1. A negative-working imageable element that is a lithographic printing plate precursor comprising a substrate having thereon an imageable layer comprising:
   a free radically polymerizable component,
   an initiator composition capable of generating radicals sufficient to initiate polymerization of said free radically polymerizable component upon exposure to imaging radiation,
   a radiation absorbing compound,
   one or more polymeric binders, and
   at least 5 weight % of core-shell particles comprising a hydrophobic polymeric core and a hydrophilic polymeric shell that is covalently bound to said polymeric core, said hydrophilic polymeric shell comprising one or more zwitterionic functional groups that are supplied from one or more ethylenically unsaturated polymerizable monomers used to prepare the polymeric shell, wherein said zwitterionic functional group is a sulfobetaine, carboxybetaine, phoshabetaine, or sulfabetaine.

2. The element of claim 1 wherein said core-shell particles are present in said imageable layer in an amount of from about 5 to about 50 weight %.

3. The element of claim 1 wherein said hydrophobic polymeric core comprises one or more hydrophobic polymers having recurring units derived from one or more alkyl (meth) acrylates.

4. The element of claim 1 wherein said hydrophilic polymeric shell comprises two or more different zwitterionic groups.

5. The element of claim 1 wherein the weight ratio of hydrophilic polymeric shell to hydrophobic polymeric core in said core-shell particles is from about 1:20 to about 1:4.

6. The element of claim 1 wherein said substrate is an anodized aluminum-containing substrate.

7. The element of claim 1 wherein said radiation absorbing compound is an infrared radiation absorbing dye that is present in an amount of from about 1 to about 30 weight % based on total imageable layer weight.

8. The element of claim 1 wherein said initiator composition comprises an onium salt.

9. The element of claim 8 wherein said onium salt is an iodonium borate comprising a diaryliodonium borate compound represented by the following Structure (IB):

(IB)

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, and $Z^-$ is an organic anion represented by the following Structure (IBz):

(IBz)

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

10. The element of claim 1 that further comprises a topcoat disposed on said imageable layer.

11. A method of making a lithographic printing plate comprising:
   A) imagewise exposing the negative-working lithographic printing plate precursor of claim 1 to form exposed and non-exposed regions,
   B) developing said imagewise exposed element off-press using a processing solution to remove predominantly only said non-exposed regions to form a lithographic printing plate.

12. The method of claim 11 wherein said negative-working lithographic printing plate precursor contains an IR-sensitive dye and said imagewise exposing step A is carried out using radiation having a maximum wavelength of from about 700 to about 1200 nm.

13. The method of claim 11 wherein said negative-working lithographic printing plate precursor is an infrared radiation-sensitive negative-working lithographic printing plate precursor comprising an aluminum-containing substrate having thereon an imageable layer comprising:

a free radically polymerizable component, an initiator composition capable of generating radicals sufficient to initiate polymerization of said free radically polymerizable component upon exposure to imaging radiation, said initiator composition comprising an iodonium borate salt, an infrared radiation absorbing dye, one or more polymeric binders, and from about 10 to about 30 weight % of core-shell particles comprising a hydrophobic polymeric core comprising recurring units of one or more $C_1$ to $C_3$ alkyl methacrylates and a hydrophilic polymeric shell that is covalently bound to said polymeric core, said hydrophilic polymeric shell comprising recurring units comprising sulfobetaine functional groups that are supplied from one or more ethylenically unsaturated polymerizable monomers used to prepare the polymeric shell, wherein the weight ratio of hydrophilic polymeric shell to hydrophobic polymeric core in said core-shell particles is from about 1:15 to about 1:6.

14. The method of claim 11 wherein said processing solution is an organic solvent-containing developer having a pH of from about 6 to about 12.

15. A negative-working imageable element that is a lithographic printing plate precursor comprising a substrate having thereon an imageable layer comprising:

a free radically polymerizable component, an initiator composition capable of generating radicals sufficient to initiate polymerization of said free radically polymerizable component upon exposure to imaging radiation, a radiation absorbing compound, one or more polymeric binders, and at least 5 weight % of core-shell particles comprising a hydrophobic polymeric core and a hydrophilic polymeric shell that is covalently bound to said polymeric core, said hydrophilic polymeric shell, wherein said hydrophilic polymeric shell comprises a copolymer comprising recurring units derived from one or more ethylenically unsaturated polymerizable monomers having a zwitterionic group and recurring units derived from one or more ethylenically unsaturated polymerizable monomers not having zwitterionic groups, in which said recurring units having zwitterionic groups comprise at least 50 mole % of the total recurring units.

16. The element of claim 1 wherein said zwitterionic functional group is represented by the following Structure (ZW):

$$—N^+(R^1)(R^2)—(CH_2)_n\text{-}A^- \qquad (ZW)$$

wherein $R^1$ and $R^2$ are independently hydrogen or a substituted or unsubstituted alkyl or aryl group, n is an integer of from 1 to 6, and $A^-$ is a $—SO_3^-$, $—CO_2^-$, $—SO_4^-$, or $—OPO_3^-$ group.

17. An infrared radiation-sensitive negative-working lithographic printing plate precursor comprising an aluminum-containing substrate having thereon an imageable layer comprising:

a free radically polymerizable component, an initiator composition capable of generating radicals sufficient to initiate polymerization of said free radically polymerizable component upon exposure to imaging radiation, said initiator composition comprising an iodonium borate salt, an infrared radiation absorbing dye, one or more polymeric binders, and from about 10 to about 30 weight % of core-shell particles comprising a hydrophobic polymeric core comprising recurring units of one or more $C_1$ to $C_3$ alkyl methacrylates and a hydrophilic polymeric shell that is covalently bound to said polymeric core, said hydrophilic polymeric shell comprising recurring units comprising sulfobetaine functional groups that are supplied from one or more ethylenically unsaturated polymerizable monomers used to prepare the polymeric shell, wherein the weight ratio of hydrophilic polymeric shell to hydrophobic polymeric core in said core-shell particles is from about 1:15 to about 1:6.

\* \* \* \* \*